United States Patent
Kim et al.

(10) Patent No.: US 6,343,647 B2
(45) Date of Patent: Feb. 5, 2002

(54) THERMAL JOINT AND METHOD OF USE

(75) Inventors: Choong-Un Kim; Seung-Mun You, both of Arlington, TX (US)

(73) Assignee: Thermax International, LL.C., Missouri City, TX (US)

( * ) Notice: Subject to any disclaimer, the term of this patent is extended or adjusted under 35 U.S.C. 154(b) by 0 days.

(21) Appl. No.: 09/481,194

(22) Filed: Jan. 11, 2000

(51) Int. Cl.[7] ................................................. F28F 7/00
(52) U.S. Cl. ........................ 165/185; 361/704; 361/708; 257/746
(58) Field of Search ..................... 165/185, 104.33, 165/907, 80.4, 80.2; 428/40.5, 220, 41.3, 41.8, 408; 361/704, 708; 257/714, 719, 720, 746; 174/16.3, 15.2

(56) References Cited

U.S. PATENT DOCUMENTS

| | | | |
|---|---|---|---|
| 3,678,995 A | * 7/1972 | Collard ......................... 165/185 |
| 4,092,697 A | 5/1978 | Spaight |
| 4,384,610 A | * 5/1983 | Cook et al. .................. 165/185 |
| 4,414,052 A | * 11/1983 | Habata et al. ............... 165/185 |
| 4,567,505 A | 1/1986 | Pease et al. |
| 4,654,754 A | * 3/1987 | Daszkowski ................. 361/388 |
| 4,685,606 A | * 8/1987 | Flint et al. ................... 228/123 |
| 4,842,911 A | 6/1989 | Fick |
| 4,915,167 A | 4/1990 | Altoz |
| 5,141,050 A | * 8/1992 | Schuft ......................... 165/185 |
| 5,198,189 A | * 3/1993 | Booth et al. ................. 420/555 |
| 5,224,017 A | * 6/1993 | Martin ......................... 361/388 |
| 5,276,586 A | * 1/1994 | Hatsuda et al. .............. 361/387 |
| 5,291,371 A | * 3/1994 | Gruber et al. ............... 361/705 |
| 5,323,292 A | 6/1994 | Brzezinski |
| 5,323,294 A | * 6/1994 | Layton et al. ............... 165/185 |
| 5,414,303 A | 5/1995 | Gonya et al. |
| 5,623,394 A | * 4/1997 | Sherif et al. ................. 165/185 |
| 5,660,917 A | * 8/1997 | Fujimori et al. ............. 428/195 |
| 5,672,297 A | * 9/1997 | Soane ......................... 428/327 |
| 5,783,862 A | * 7/1998 | Deeney ....................... 257/714 |
| 5,858,537 A | * 1/1999 | Brown et al. ............... 428/408 |
| 5,918,665 A | * 7/1999 | Babcock et al. ........ 165/104.33 |
| 5,930,893 A | * 8/1999 | Eaton ....................... 29/890.03 |
| 5,944,097 A | * 8/1999 | Gungor et al. .............. 165/185 |
| 6,046,907 A | * 4/2000 | Yamaguchi .................. 361/704 |
| 6,054,198 A | * 4/2000 | Bunyan et al. ............. 428/40.5 |

OTHER PUBLICATIONS

Bob Rauch, Test Methods for Characterizing the Thermal Transmission Properties of Phase–Change Thermal Interface Materials, *Electronic Cooling*, vol. 5, No. 2, May 1999.

R.S. Cook Et Al., A Novel Concept for Reducing Thermal Contact Resistance, AIAA/ASME 3rd Joint Thermophysics, Fluids, Plasma and Heat Transfer Conference, Jun. 7–11, 1982, St.Louis, Missouri.

Charles L. Mantell, Engineering Materials Handbook, pp. 16–5 –16–11,First Edition, New York, 1958.

* cited by examiner

*Primary Examiner*—Ira S. Lazarus
*Assistant Examiner*—Terrell McKinnon
(74) *Attorney, Agent, or Firm*—Jenkens & Gilchrist A Professional Corporation

(57) ABSTRACT

A thermal joint for facilitating heat transfer between two components is described. The thermal joint is formed from an alloy of at least two constituents. The alloy has a liquid temperature and a solid temperature. When the operating temperature falls between the liquid temperature and the solid temperature, the alloy has at least one liquid phase which is in substantial equilibrium with at least one solid phase. The thermal joint is used between a heat-generating component, such as a semiconducting device, and a heat-dissipating component, such as a heat sink. Such thermal joint substantially reduces the thermal resistance between the two components.

32 Claims, 5 Drawing Sheets

THERMAL JOINT AND METHOD OF USE

FIELD OF THE INVENTION

The invention relates to a thermal joint for transferring heat from one object to another. The invention also relates to a method of transferring heat between a heat-generating component, such as a semiconductor device, and a heat-removing component, such as a heat sink.

BACKGROUND OF THE INVENTION

There are numerous devices which require efficient heat transfer. For example, high speed computers and other fast electronic systems often require assemblies of many integrated circuit chips in which each chip contains many active devices, and many chips are spaced closely together. During normal operation, the devices dissipate a very large power density, especially bipolar transistor devices. Proper electronic operation of the devices necessitates a relatively cool operating temperature which, in turn, requires adequate cooling of the power density. Conversely, the maximum allowable operation temperature of the device and integrated circuit chip in combination with the limited cooling capacity presently available limit the allowable power density, circuit density, and system speed. Improved device and integrated circuit chip cooling would result in increased permissible power density, circuit density, and system speed.

Whenever it is desired to transfer or dissipate heat from one object to another by conduction, an important component in the exchange is the interfacial joint between the two objects. A typical method of enhancing the heat exchange between two objects is to machine the interface surfaces of the two objects to high tolerances and hold them tightly together so that a relatively high percentage of the joining surface areas are in contact. Not only is this method expensive, but the thermal efficiency of the joint is a function of the smoothness of the surface finish and the amount of pressure applied thereacross. Even though the surface irregularities are microscopic and the pressure employed between the two contacting surfaces large, only relatively low thermal efficiency results. This is because the interface region between the two objects includes relatively limited contact regions surrounded by air gaps and voids. The presence of air gaps and voids in the interface region tends to increase the thermal resistance of the interface.

The thermal resistance of an interface between two objects can be reduced by providing an interface material which fills the air gaps and voids in the joining surfaces. Several materials, ranging from thermal grease to phase-transition compounds, have been used in some in cases, typically in electronic device cooling, as a contact material. A main function of these interstitial materials is to minimize the number of voids and to increase the contact area either by viscous flow upon application of contact pressure or by chemical reaction. However, these contact materials are largely based on compositions with relatively poor thermal conductivity, such as amorphous grease/oil, silicon grease, and paraffin wax. As such, these contact materials offer only limited gain in thermal performance. In an operating environment which experiences high heat flux or high operating temperatures, the performance of these materials as a thermal joint may rapidly deteriorate due to the loss of volatile constituents. To alleviate such problems, these materials are sometimes mixed with a thermally conductive powder or combined with a metallic frame. However, such designs lead to complexity and increased costs.

Brazing or soldering has been considered as another way to reduce the thermal resistance of an interface between two objects. Although brazing a metallic interface between two objects may improve the thermal contact, its application is limited only to the surface that can react with the soldering material. For non-reactive surfaces, such as aluminum, ceramic materials, and plastics, deposition of a bond layer (typically noble metals) should be preceded before soldering or brazing. However, fracture of the brazed material may occur due to thermal mismatch between joining bodies or deposited layers. Factors, such as relatively high costs and difficulty of rework, may limit the application of soldering or brazing in forming an efficient thermal joint.

For the foregoing reasons, there is a need for a thermal joint which would offer relatively high thermal conductivity. Preferably, the thermal conductivity of the thermal joint is comparable to typical metals or their alloys. It would be more desirable if the thermal joint involved minimum complexity so that it can be easily implemented.

SUMMARY OF THE INVENTION

The aforementioned need is met by one or more aspects of the invention. In one aspect, the invention relates to a thermal joint for facilitating heat transfer. The thermal joint includes an alloy of at least two constituents; the alloy has an operating temperature $T_P$, a liquid temperature $T_L$, and a solid temperature $T_S$; when the operating temperature $T_P$ falls between the liquid temperature $T_L$ and the solid temperature $T_S$, the alloy includes at least a liquid phase and at least a solid phase. Preferably, the liquid phase is substantially in equilibrium with the solid phase. The thermal joint is so dimensioned to be positioned between a heat-generating component and a heat-dissipating component.

In another aspect, the invention relates a device that includes the thermal joint positioned between a heat-generating device and a heat-removing device. Such a device may be incorporated in various apparatuses, including but not limited to, computers, printers, cellular phones, television sets, video cassette recorders, power amplifiers, transformers, power supply circuits, high-power transistors, diodes, and switching boards.

In still another aspect, the invention relates to a method of dissipating heat. The method include one or more of the following steps: (a) providing a thermal joint comprising an alloy of at least two constituents between a heat-generating component and a heat-dissipating component; and (b) operating the thermal joint at a temperature between the liquid temperature $T_L$ and the solid temperature $T_S$ of the alloy so that the alloy includes at least a liquid phase and at least a solid phase. Preferably, the liquid phase is substantially in equilibrium with the solid phase.

In yet another aspect, the invention relates to method of making a thermal joint with low thermal resistance. The method includes one or more of the following steps: (a) providing an alloy of at least two constituents which has a liquid temperature $T_L$ and a solid temperature $T_S$; (b) placing the alloy between a heat-generating component and a heat-dissipating component to define at least one interface having interfacial voids; (c) subjecting the alloy to an operating temperature above the solid temperature $T_S$ to generate a liquid phase to fill the interfacial voids; and (d) lowering the operating temperature below the liquid temperature $T_L$.

Additional aspects of the invention, advantages, and objects of the invention become apparent with the following description.

DESCRIPTION OF EMBODIMENTS OF THE INVENTION

Figure 1:
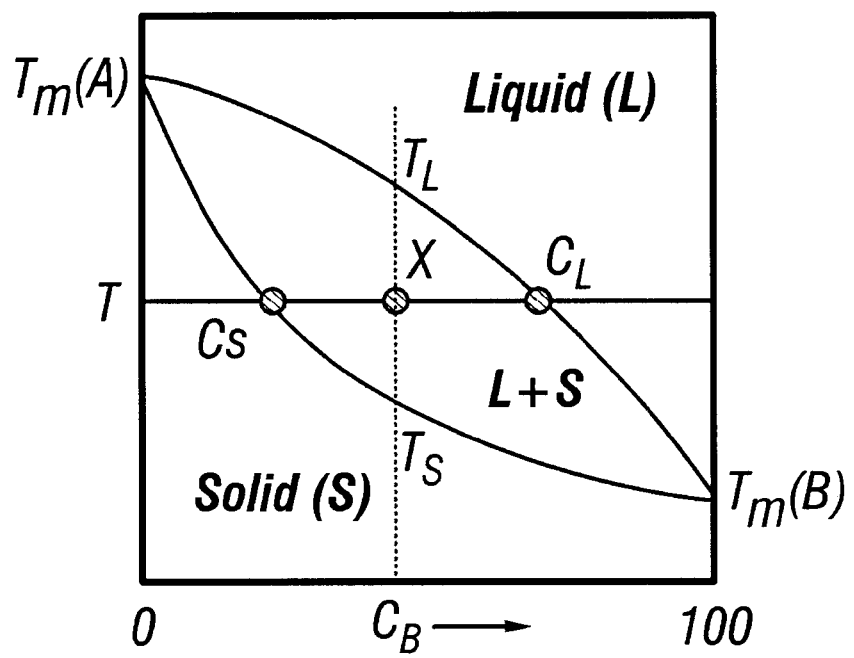
FIG. 1 is a schematic representation of a phase diagram of an imaginary alloy system of A and B elements.

Embodiments of the invention provide a thermal joint for facilitating heat transfer between two components. The thermal joint comprises an alloy of at least two constituents and is so dimensioned to be positioned between a heat-generating component and a heat-dissipating component. The alloy has a liquid temperature $T_L$ above which the alloy turns substantially or completely liquid and a solid temperature $T_S$ below which the alloy turns substantially or completely solid. When the thermal joint is operated under a temperature $T_P$ between the liquid temperature $T_L$ and the solid temperature $T_S$, the alloy has at least one liquid phase and at least one solid phase. Preferably, the liquid phase (s) is substantially in equilibrium with the solid phase (s). Under such operating conditions, while the solid phase maintains its basic geometry, the liquid phase flows into the air gaps and voids between the two joining surfaces of the components. As such, the air gaps and voids between the two joining surfaces of the components are minimized or completely eliminated. Consequently, the thermal resistance between the two joining surfaces are reduced, and the thermal conduction between the two joining surfaces is increased.

The term "constituent" refers to an element, a compound or a composition. The term "thermal joint" refers to any structure which is positioned between two joining surfaces of adjacent objects for facilitating thermal conduction. The thermal joint can be any geometric shape, such as sheets, films, strips, meshes, powders, etc. The term "alloy" herein refers to any mixture or blend of at least two elements, two compositions, or two compounds with the resulting melting point different from those of the respective elements. Moreover, the alloy should have a liquid temperature $T_L$ above which the alloy turns substantially or completely liquid and a solid temperature $T_S$ below which the alloy turns substantially or completely solid. Between the liquid temperature $T_L$ and the solid temperature $T_S$, the alloy maintains at least one liquid phase and at least one solid phase. Preferably, all phases are in substantial phase equilibrium. Suitable alloys may be binary alloys, ternary alloys, quaternary alloys, etc. They also include those alloys formed from five or more elements, compositions, or compounds. Moreover, suitable alloys need not be metallic.

Preferably, a suitable alloy is a homogenous mixture or solid solution of two or more metals. But suitable alloys need not be a solid solution of two or more metals. Some alloys are not a homogenous mixture of two or more metals or a solid solution of two or more metals. Nevertheless, these non-homogenous alloys may still be used in embodiments of the invention, provided that they have the following melting characteristics: the alloy has a liquid temperature above which the alloy turns substantially or completely liquid and a solid temperature below which the alloy turns substantially or completely solid. When the alloy is heated to a temperature between the solid temperature and the liquid temperature, at least one liquid phase co-exists with at least one solid phase. Preferably, all phases, including all of the liquid phases and the solid phases, are in substantial or complete equilibrium with each other.

In a system with a perfect phase equilibrium, the chemical potential of each chemical species in all existing phases are the same. It is noted that chemical potential is defined as a partial molar Gibbs free energy:

$$\mu_i = \left(\frac{\partial G}{\partial n_i}\right)_{T,P,n_j}$$

where $\mu$, G and n denote the chemical potential, Gibbs free energy, and mole number, while i and j represent various chemical species present in the equilibrium system. In a binary alloy (A—B) at temperature T where a liquid phase (L) and a solid phase ($\alpha$) is in perfect equilibrium, the following equilibrium conditions are satisfied.

$\mu_A^L = \mu_A^\alpha$ and $\mu_B^L = \mu_B^\alpha$

Similarly, in a perfect three-phase equilibrium in a binary system (a liquid phase L and two solid phases $\alpha$ and $\beta$), the following conditions are satisfied.

$\mu_A^L = \mu_A^\alpha = \mu_A^\beta$ and $\mu_B^L = \mu_B^\alpha = \mu_B^\beta$.

Generally, the number of equilibrium conditions increases with the number of chemical species in the alloy system. In the case of ternary alloys (A—B—C) with two phase equilibrium (L and $\alpha$), the following conditions are met.

$\mu_A^L = \mu_A^\alpha$; $\mu_B^L = \mu_B^\alpha$; $\mu_C^L = \mu_C^\alpha$.

It is noted, however, that a perfect phase equilibrium is rarely achieved in reality. Instead, only substantial phase equilibrium is achieved. In other words, when the chemical potential of a chemical species in all existing phases of a system is substantially the same, it is said that such a system has achieved a substantial phase equilibrium. When a suitable alloy is used in embodiments of the invention, various phases of the alloy preferably are in either substantial equilibrium or perfect equilibrium. However, it is also possible to operate a suitable alloy under a non-equilibrium condition to achieve substantially the same results.

In accordance with embodiments of the invention, an alloy with at least one liquid phase and at least one solid phase is used to form a thermal joint to facilitate heat transfer between two components. For the sake of convenience, such an alloy is referred to as a "two-phase alloy". It should be understood that whenever the term "two-phase alloy" is used, it refers to an alloy with at least one liquid and at least one solid phase; however, the alloy may include more liquid phases and/or more solid phases.

FIG. 1, which is a schematic representation of a phase diagram of an alloy, illustrates one type of the two-phase alloy used in embodiments of the invention to form a thermal joint. Referring to FIG. 1, when element A and element B is alloyed, the resulting alloy has a melting characteristic which is different from the melting characteristic of either element A or element B. Instead of melting completely at a single melting point, the alloy melts in a range of temperatures, i.e., from $T_S$ to $T_L$. The $T_S$ and $T_L$ of the alloy generally fall between those of element A and element B. They generally decrease as the content of element B, $C_B$, increases. But $T_S$ of the alloy decreases faster than $T_L$ of the alloy as a function of the content of element B. At a given $C_B$, when the alloy is heated to a temperature T between $T_S$ and $T_L$, the alloy maintains a liquid phase which is in equilibrium with a solid phase. In a perfect phase equilibrium system, the amount of the liquid phase and the solid phase can be calculated according to the so-called "lever rule".

$$\text{solid phase fraction} = \frac{C_L - X}{C_L - C_S}; \quad \text{liquid fraction} = \frac{X - C_L}{C_L - C_S},$$

where $C_L$ and $C_S$ denote the composition of the liquid and the solid phase at the given temperature, respectively, and are indicated in FIG. 1.

At any given $C_B$, as the temperature of the alloy increases, the liquid fraction increase; conversely, as the temperature of the alloy decreases, the solid fraction increases. This relationship can be advantageously utilized to minimize the presence of a hot spot. For example, when a local hot spot develops, the temperature of that spot increases. This would lead to an increased amount of liquid in the vicinity of the hot spot. As more liquid is generated, thermal contact in the vicinity of that spot is improved, thereby removing more heat in that area. Consequently, the hot spot is substantially minimized or eliminated.

Figure 2:
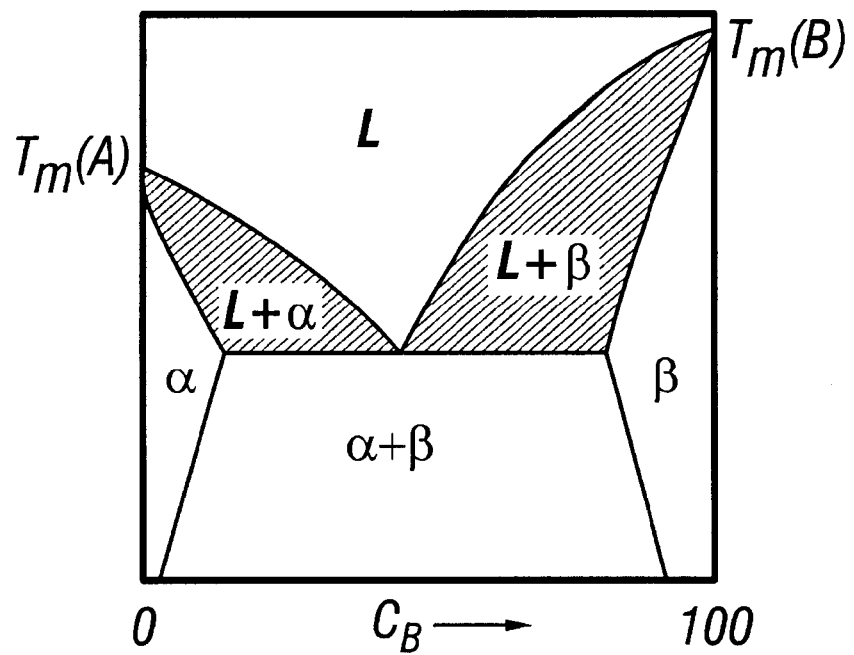
FIG. 2 is a schematic representation of a simple binary Eutectic phase diagram with A and B elements.
Figure 3:
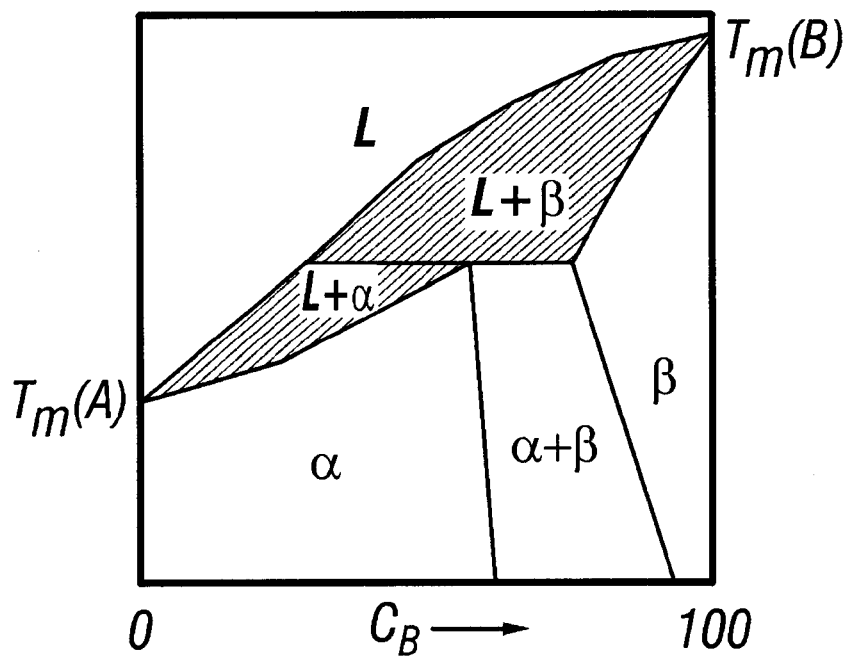
FIG. 3 is a schematic representation of a binary Peritectic phase diagram with A and B elements.

In addition to the scenario represented by FIG. 1, an alloy of two constituents may form an alloy with a phase diagram represented by either FIG. 2 or FIG. 3. FIG. 2 represents the phase diagram of an Eutectic alloy, whereas FIG. 3 represents the phase diagram of a Peritectic alloy. These alloy systems differ from the alloy of FIG. 1 in that they do not form a solid solution in the solid state. Instead, they form one or more phases in the solid state, depending on the composition and the temperature of the alloy. Regardless of the differences, both phase diagrams include regions in which a liquid phase co-exists with a solid phase (these regions are indicated by the shaded area on the phase diagram). When an alloy composition and operating temperature falls into the shaded region, an alloy system with at least one liquid phase co-existent with at least one solid phase is obtained. Such two-phase alloy systems can be used in embodiments of the invention to form a thermal joint.

Although FIGS. 1–3 are described with respect to a binary alloy, the phase diagrams may also represent a ternary alloy or alloys with a higher number of alloying elements, compositions, or compounds with some added complexity. Regardless of the number of alloying elements or compounds, the vertical section (i.e., temperature versus fixed alloy composition) of any suitable alloy follows one of the three phase diagrams or any combination of the three phase diagrams. In other words, suitable alloys are not limited to binary and ternary alloys. Alloys with four, five, six, or a higher number of constituents (i.e., alloying elements, composition, or compounds) may also be used in embodiments of the invention.

Figure 4:
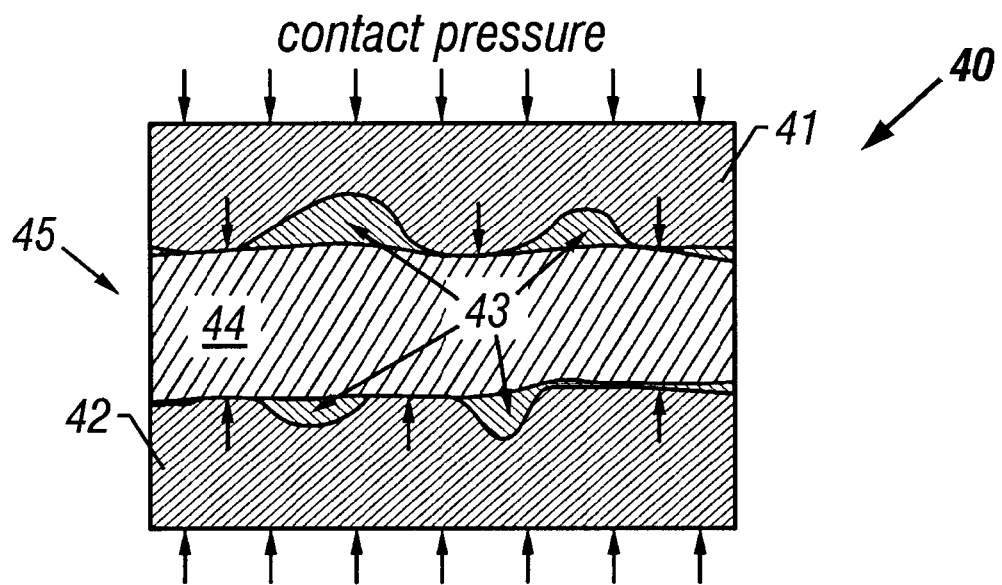
FIG. 4 is a schematic representation of the thermal joint under an operating condition in accordance with one embodiment of the invention.

Referring to FIG. 4, a cross sectional view of a thermal joint used between two components in accordance with embodiment of the invention is illustrated. A device 40 includes a heat-generating component 41 and a heat-removing component 42. A thermal joint 45 in accordance with embodiments of the invention is placed between the heat-generating component 41 and the heat-removing component 42.

Before operating temperature is raised above the solid temperature $T_S$ of the alloy, the voids in the surface of the components are typically filled with air (not shown in FIG. 4). These voids and air gaps are mainly responsible for relatively high thermal resistance between the two components. After the operating temperature is raised above the solid temperature of the alloy, a liquid phase is generated. Because the two components are under contact pressure, the pressure causes the liquid phase to fill the air gaps and voids, while the solid phase 44 maintains substantially the same geometry. As illustrated by FIG. 4, the liquid phase 43 is retained by the solid phase 44 in the gaps and voids, thereby obviating the necessity of any liquid retention mechanism. Because the number of air gaps and voids are substantially reduced or eliminated, the thermal resistance is substantially reduced.

As described previously, any alloy which exhibits co-existence of at least one liquid phase and at least one solid phase within a certain temperature range can be used in embodiments of the invention to make a thermal joint. Preferably, a suitable alloy should have a good thermal conductivity, should start to melt partially at a temperature above room temperature but below a typical operating temperature, and should maintain substantial phase equilibrium at the operating temperature. Moreover, at the operating temperature, the alloy should produce a sufficient amount of liquid to fill most or all voids, but not to the point where the liquid starts to leak. Other design consideration include oxidation resistance, costs, ease of rework, and ease of handling.

Generally, the temperature range of the solid/liquid phase equilibrium is fixed once an alloy is selected. In cases when there is a need to decrease the fraction of the liquid phase without altering the chemical composition of the alloy, additives can be used in conjunction with the two-phase alloy. Generally, an additive should not participate in the chemical equilibrium of the alloy. Suitable additives preferably should have a relatively high thermal conductivity and exist as a solid form under operating conditions. They can be metallic, ceramic, or others. Examples of such additives include, but are not limited to, diamond powders, ceramic powers, and metal powders (e.g., Cu, Ag, Au, and Pb). Moreover, a predetermined amount of metallic powder or metallic fibers can provide heterogeneous nucleation sites, promoting formation of the solid phase around them. While the basic operation of the two-phase alloy is not changed, the increased fraction in the solid phase due to the presence of the metallic additive provides a convenient way of controlling the liquid phase fraction without substantially changing the alloy composition.

Examples of suitable alloys include, but are not limited to, alloy systems containing any combination of the following elements: Bi, Pb, Sn, Cd, Sb, In, Tl, Te, Se, Ga, and Hg. Both transition metals and non-transition metals may be added to the alloy system. Typical non-transition metals include, but are not limited to, Na, Li, Al, Mg, Zn, As, K, Rb, and Cd. Suitable transition metals include all known transition metals, including but not limited to, Sc, Ti, V, Cr, Mn, Fe, Co, Ni, Cu, Zn, Y, Zr, Nb, Mo, Tc, Ru, Rh, Pd, Ag, Cd, Hf, Ta, W, Re, Os, Ir, Pt, Au, Hg, Lanthanides and Actinides. Preferred transition metals include Cu, Au, and Ag. In addition, semi-conducting elements, such as Si, and Ge, can be added to the alloys. Examples of suitable alloys which can be used in embodiments of the invention include, but are not limited to, Bi—In, Sn—In—Ga, Bi—Pb—In, Bi—In—Sn, and Bi—Pb—Cd.

Additional suitable alloys include alloy systems containing any combination of noble metals, Cu, Ag, Au, Pt, Pd, Si, and Ge. Moreover, alloys containing any combination of Al, Mg, Zn, Cr, Ni, and Be, may also be used. In addition, one or more transition metals can be added to the aforementioned alloys to modify the chemical stability of the alloys. Examples of suitable alloys which can be used in embodiments of the invention include, but are not limited to, Au—Si, Ag—Si, Au—Ge, Cu—Zn, Al—Ag, Ag—Ge, Ag—Cu—Zn, and Ag—Cu—Sn.

As described previously, suitable alloys need not be metallic. Other alloy systems may also be used in embodiments of the invention. For example, non-metallic alloys may include compound alloys of chlorides, oxides, nitrides, sulfides, and antimonides. MgCl—NaCl is an example of a suitable chloride alloy. Suitable silica alloys include, but are not limited to, Flint glass, $SiO_2/CaCO_2$, $SiO_2/PbO$, and $SiO_2/TiO_2$. Numerous other alloys are apparent to those skilled in the art.

A preferred form of a two-phase alloy is a sheet that is rolled into a predetermined thickness. Other forms of the alloy are also possible. For example, a two-phase alloy can be coated to one or both of the joining surfaces using physical, chemical, or electrochemical deposition techniques. It can also be placed as a powder to the joining surfaces, which consolidates into a layer under operating conditions. Since the operation of a two-phase alloy does not substantially depend upon the wetting of the liquid phase to a joining surface, it obviates the need for surface preparation. In fact, non-wetting surface, such as an aluminum surface, would facilitate the assembly and disassembly of the interface. In the case when a joining surface may react with an alloy, the surface should be coated with a non-reactive layer, such as alumina. Such a thin layer of electrically non-conducting coating is helpful in cases where a high performance, electrically insulating, thermal joint is desired.

In addition to a thermal joint and devices made therefrom, embodiments of the invention also provide a method of dissipating heat from one component to another. The method includes: (a) providing a thermal joint formed from an alloy between a heat-generating component and a heat-dissipating component; and (b) operating the thermal joint at a temperature between the liquid temperature $T_L$ and the solid $T_S$ of the alloy so that the alloy has at least a liquid phase and at least a solid phase. Preferably, the liquid phase is substantially in equilibrium with the solid phase. More preferably, the thermal joint is in direct contact with one surface of the heat-generating component. Similarly, it is preferred that the thermal joint is also in direct contact with one surface of the heat-removing component. Heat-generating components include any device or object that has heat to be removed. Examples of a heat-generating component include, but are not limited to, semiconductor devices, microelectronic devices, reactors, and multi-chip modules. Heat-removing components include any device or object that can remove heat from a heat source. Examples of a heat-removing component include, but are not limited to, heat sinks, heat pipes, and cooling plates. The heat-dissipating method in accordance with embodiments of the invention may be used in any system which requires removal of heat from one component to another.

It should be recognized that, in practicing the invention, the operating temperature $T_P$ need not always be kept above the solid temperature $T_S$ of an alloy during operation. Instead, the operating temperature only needs to be above the solid temperature $T_S$ of an alloy for a time period long enough so that the interfacial air gaps and voids are substantially filled by the liquid phase. After the air gaps and voids are substantially filled by the liquid phase, the operating temperature may be lowered below $T_S$ so that the entire thermal joint includes only solid phase. Therefore, the final operating temperature in practicing the invention may either be between $T_S$ and $T_L$ or at or below $T_S$.

As mentioned above, both the thermal joint and the heat-dissipating method in accordance with embodiments of the invention may be used in any device which requires heat transfer from one component to another. For example, the thermal joint may be used in internal and external thermal packaging of micro-electronic devices used in super computers, work stations, personal computers, notebooks, printers, cellular phones, and in household electronic appliances, such as televisions and VCRs, and in controlled electronic systems for various vehicles, both commercial and military. Moreover, applications in thermal packaging for electronic components further include power systems and telecommunication systems, such as base-stations, power amplifiers, transformers, AC and DC power supply circuits, high power transistors, diodes, and switch boards. The thermal joint may also be used in any type of interface for heat sink assemblies or heat pipe assemblies. The application of the thermal joint may further include interface for heat exchangers, condensers and other similar devices. Additional applications include thermal interface used in thermoelectric power generators and cooling devices. Other applications are apparent to those skilled in the art. For example, U.S. Pat. No. 4,092,697, teaches a heat transfer mechanism for integrated circuit packages. The thermal joint in accordance with embodiments of the invention may be used to replace the heat transfer mechanism in the disclosed integrated circuit packages. Similarly, U.S. Pat. No. 5,323,292, discloses a integrated multi-chip module having a conformal chip-heat exchanger interface. The thermal joint may also be used to replace the conformal chip-heat transfer interface in the disclosed multi-chip module. The disclosures of the two patents are incorporated herein by reference in their entirety.

The following examples merely illustrate an embodiment of the invention and do not limit the scope of the invention as otherwise described herein. Any numerical values described herein are approximate numbers.

EXAMPLE 1

This example demonstrates the feasibility of using the thermal joint in accordance with embodiments of the invention to reduce thermal resistance without using a liquid retention mechanism.

Figure 5:
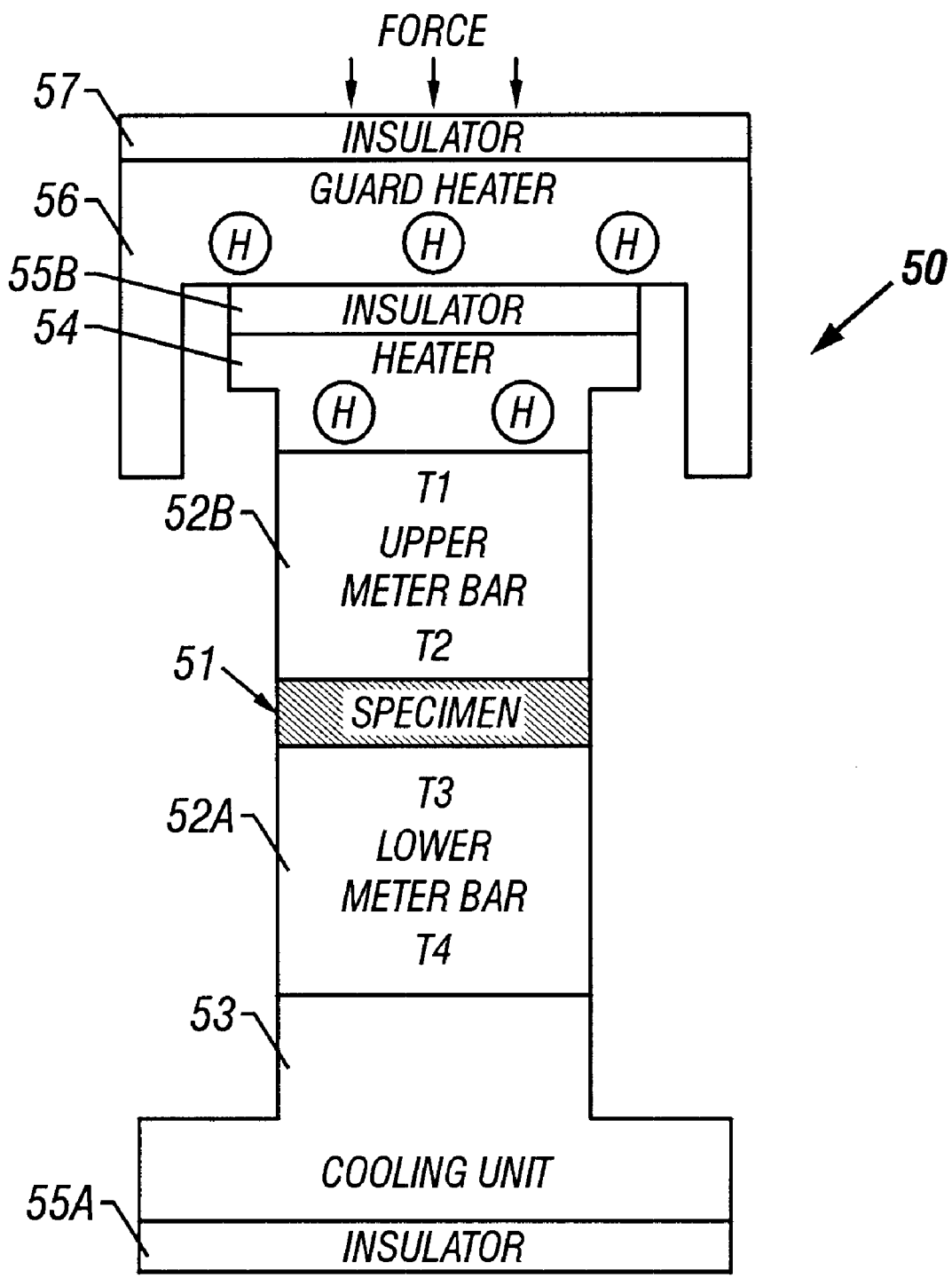
FIG. 5 is a schematic representation of an apparatus used to measure the thermal contact impedance of various samples.

A testing procedure similar to ASTM D-5470 (Test Method A) was employed to measure thermal contact impedance as a function of heat flux for various groups of samples. FIG. 5 illustrates a typical apparatus used in accordance with ASTM D-5470, Test Method A. In the apparatus 50, a test specimen 51 is placed between a lower meter bar 52A and an upper meter bar 52B. The lower meter bar 52A sits on top of a cooling unit 53, which in turn is positioned on top of a insulator 55A. On the other hand, a heater 54 is positioned on top of the upper meter bar 52B and insulator 55B is placed on top of the heater 54. A guard heater 56 is provided on top of the insulator 55B, which in turn is covered by an insulator 57. A downward force is applied on the insulator 57 so that the force is transmitted vertically to the specimen 51.

The actual apparatus used to measure thermal contact impedance was similar to the one shown in FIG. 5 except that a thicker insulation block was used in place of the insulator 57 and the guard heater 56. But similar effect was obtained. While ASTM D-5470 specifies that the suggested force applied to the test stack should be 3.0±0.1 MPa. In contrast, only about 69±0.5 KPa (about 10 psi) was applied in the testing. The lower contact pressure is considered more appropriate because the majority of applications involve smaller clamping force.

Three types of thermal joints were tested: bare contact (i.e., no thermal joint is provided); thermal joint with a two-phase alloy; and thermal joint with a liquid phase alloy. It is noted that the thermal joints with a liquid phase alloy refers to a liquid metal thermal joint formed by completely melting the alloy at a temperature above its liquid temperature. In contrast, the thermal joint with a two-phase alloy refers to the thermal joint in accordance with embodiments of the invention. Both alloys used in the tests were Bi/In/Sn ternary alloys. Specifically, the one phase alloy is a Bi/In/Sn ternary Eutectic and melts completely at 60° C. The two-phase alloy has about 56 wt. % of In, about 26 wt. % of Sn, and about 18 wt. % of Bi. The two-phase alloy starts to melt at about 60° C. but maintains a liquid phase and a solid phase until the temperature exceeds about 90° C. Between about 60° C. and about 90° C., the alloy has three equilibrium phases present.

Another sample used for comparison was a commercial product available under the trade name "Chomerics T412" from the Chomerics Division of Parker Hannifin Corp. in Woburn, Mass. It was made of a thermal tape and consisted of Al strip and pressure sensitive acrylic adhesive loaded with titanium diboride.

In order to examine the extent of liquid loss during operation, no liquid retention system was employed during the testing. The test data collected for all three thermal joints are summarized in Table 1.

TABLE 1

| heat flux, W/cm$^2$ | Impedance, K-cm$^2$/W |
|---|---|
| Bare Contact | |
| 2.00 | 4.20 |
| 4.00 | 4.24 |
| 6.00 | 4.24 |
| Chomerics T412 | |
| 3.00 | 2.50 |
| 6.00 | 2.45 |
| 9.00 | 2.42 |
| Single Phase Alloy | |
| 8.00 | 0.41 |
| 16.00 | 0.36 |
| 40.00 | 0.20 |
| Two-Phase Alloy | |
| 15.00 | 0.31 |
| 30.00 | 0.22 |
| 50.00 | 0.13 |

Figure 6:
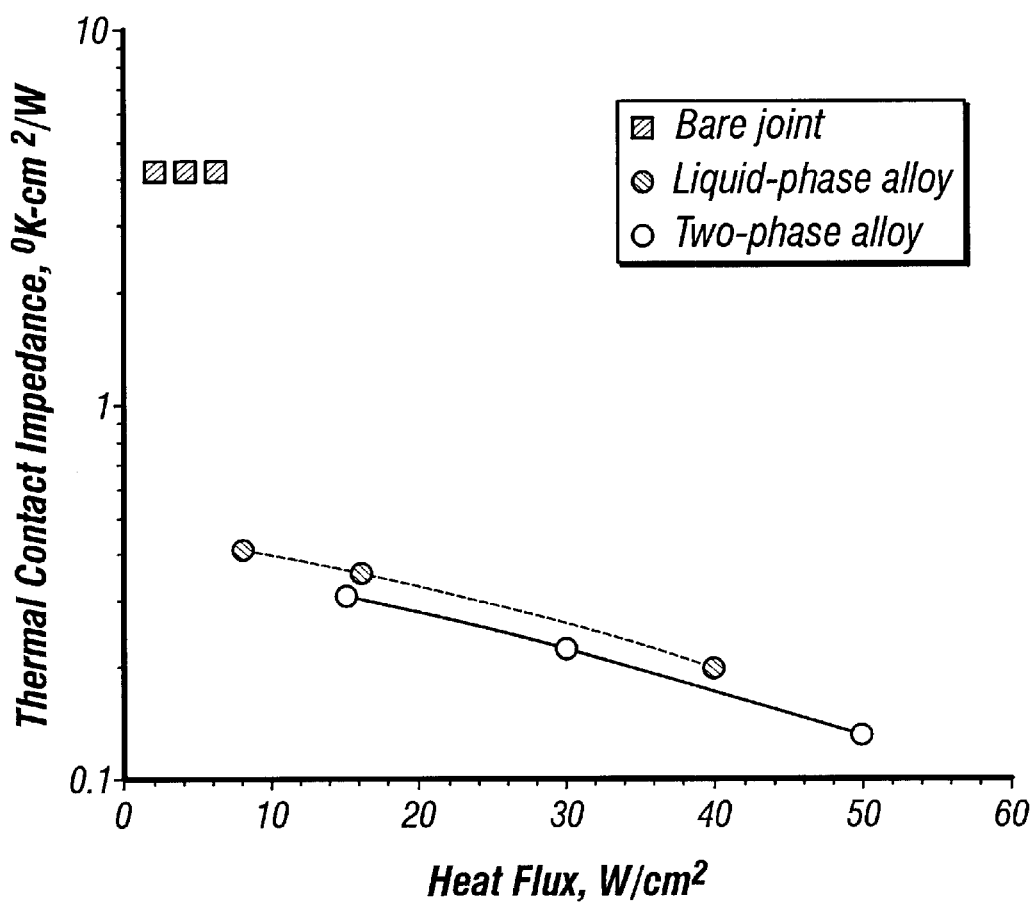
FIG. 6 is a plot showing the relationship of thermal contact impedance as a function of heat flux for various samples.

FIG. 6 is a graphical representation of the test data. Referring to FIG. 6, thermal contact impedance in logarithm scale is plotted as a function of heat flux. The filled solid squares represent the values for the thermal contact impedance of bare contact. The filled solid circles represent the thermal contact impedance for a thermal joint with a liquid phase alloy, whereas the unfilled circles represent the thermal contact impedance for the thermal joint with a two-phase alloy. The test data indicate that the thermal joint with a two-phase alloy is comparable or better than the thermal joints with a liquid phase alloy in reducing the interfacial thermal resistance.

During the tests, it was observed that the thickness of the thermal joint with a liquid phase alloy had a initial thickness of about 150 microns but continued to shrink under contact pressure, expelling liquid out of the interface. On the other hand, thickness reduction and alloy extrusion in the thermal joint with a two-phase alloy were substantially negligible. This indicates that a liquid retention mechanism may not be necessary in embodiments of the invention.

In addition to the contact pressure of 10 psi, additional tests with different contact pressures, as low as 3 psi, were conducted. It was observed that the performance of the thermal joint with a two-phase alloy is not substantially affected by the contact pressure variation. This appears to indicate that the presence of one or more solid phases facilitates the liquid-phase redistribution to interfacial voids, even at a small contact pressure.

EXAMPLE 2

This example demonstrates that the operating temperature need not be kept above the solid temperature of an alloy throughout entire operation. A specimen substantially similar to the two-phase alloy used in Example 1 was made and placed in the same apparatus. The thermal contact impedance of the specimen was measured as a function of heat flux in accordance with the method described in Example 1. It was observed that, when the heat flux was less than 40 W/cm$^2$, the specimen was in the solid form. At about 40 W/cm$^2$, the specimen started to melt, filling the interfacial voids and gaps. As a result, the thermal contact impedance decreased. After reaching a heat flux of about 60 W/cm$^2$, the specimen was allowed to cool down to room temperature and was re-heated to about 50 W/cm$^2$. The thermal contact impedance was also measured during the second heating. The data is represented in graphical form in FIG. 7.

Figure 7:
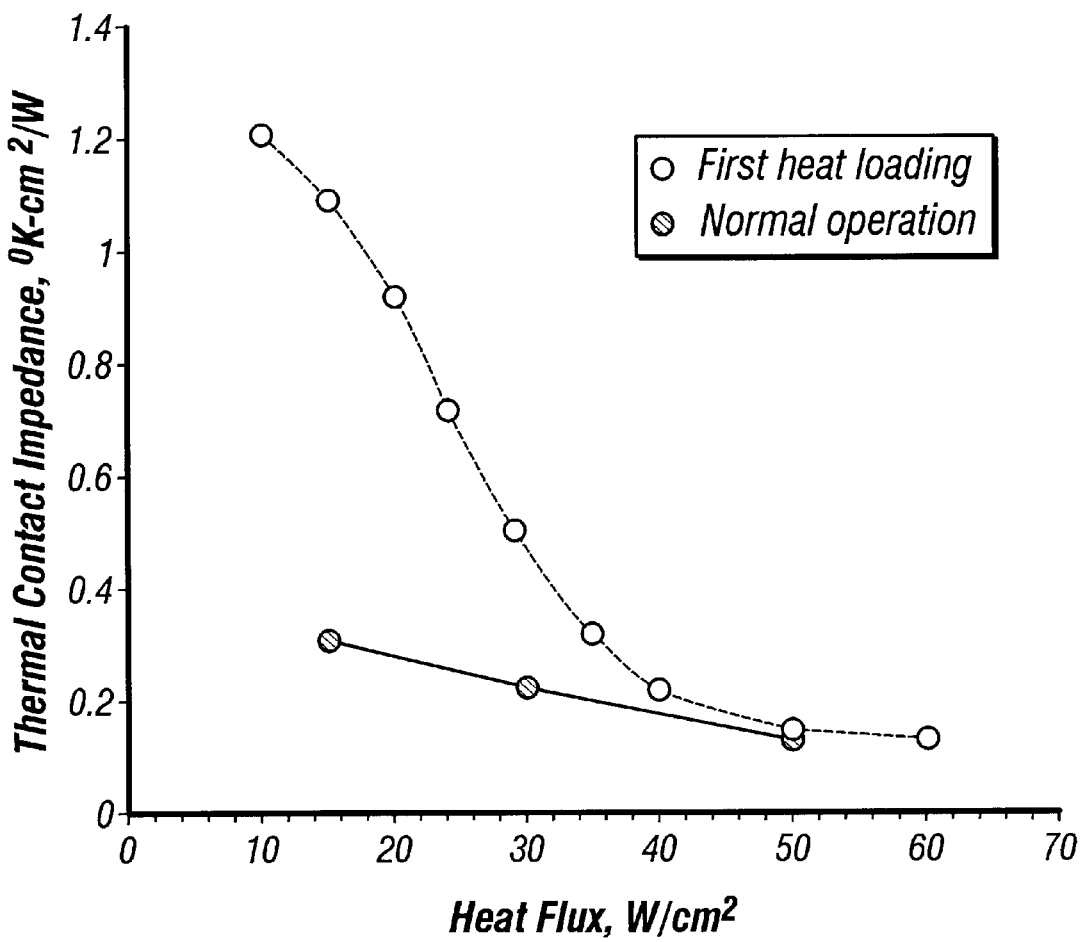
FIG. 7 is a plot showing the relationship of thermal contact impedance as a function of heat flux for a sample subject to various operating temperatures.

Referring to FIG. 7, the thermal contact impedance obtained from the first heat loading is represented by the unfilled circles, whereas the filled circles represent the thermal contact impedance obtained from the second heat loading. It can be seen that the thermal contact impedance of the interface at low heat flux (i.e., when the specimen was in the solid state) in the second heat loading is at least two times lower than that in the first heat loading. This indicates that the voids and gaps were filled by liquid phase during the first heat loading. As a result, after the specimen was cooled down to room temperature, a low thermal contact impedance interface was obtained even without the presence of a liquid phase. It was observed that the thermal contact impedance did not change significantly with additional heat loading.

This example shows that a thermal joint with low thermal resistance can be obtained in accordance with embodiments of the invention. While the thermal joint with low thermal resistance is obtained by operating a suitable alloy at a temperature above its solid temperature, the operating temperature need not be kept above the solid temperature. After the interfacial gaps and voids are substantially filled by the liquid phase, the operating temperature may be lowered below the solid temperature. Such a thermal joint still exhibits good thermal conductivity.

As demonstrated above, embodiments of the invention provide a thermal joint and a method of transferring heat. The embodiments of the invention may offer one or more of the following advantages. First, there is no substantial loss of liquid under operating conditions even without using a liquid retention system. This substantially simplifies the manufacturing of any device which incorporates such a thermal joint, thus reducing costs. Second, because the performance of the thermal joint is not substantially dependent upon the contact pressure, the thermal joint can be used under both relatively high contact pressures or relatively low contact pressures. Third, the thermal joint may reduce or minimize the presence of a hot spot due to the presence of a liquid phase under operating conditions. Due to the presence of a solid phase, the thermal joint also offers rigidity which may be desirable in some applications. Finally, due to its simplicity, the thermal joint may be used in various applications previously considered impractical or infeasible.

While the invention has been described with a limited number of embodiments, modifications and variations therefrom exist. For example, although embodiments of the invention obviate the need for a liquid retention system, such a system may be used under certain conditions. Similarly, although wetting of a joining surface is not necessary, there may be situations where wetting a joining surface would be desirable. Although the thermal joint is formed from a suitable alloy with above described melting characteristics, materials not considered as alloys but which possess similar melting characteristics may be used to replace an alloy. Finally, it is noted that the alloy is preferably under an equilibrium or substantial equilibrium condition. But it is possible to operate the alloy under a non-equilibrium condition but still achieves substantially the same results of filling the interfacial voids and decreasing the interfacial thermal resistance. For example, the benefits of the invention can be realized by turning a suitable alloy or metal entirely into a liquid phase at a high temperature so as to fill the interfacial gaps and voids and then operating the thermal joint below the solid temperature or melting point. Appended claims intend to cover all such variations and modifications as falling within the scope of the invention.

What is claimed is:

1. A thermal joint for facilitating heat transfer, comprising consisting essentially of:
   an alloy of at least two constituents, the alloy including at least a liquid phase and at least a solid phase, the liquid phase being substantially in equilibrium with the solid phase;
   wherein the alloy has an operating temperature $T_P$, a liquid temperature $T_L$, and a solid temperature $T_S$, and the operating temperature $T_P$ falls between the liquid temperature $T_L$ and the solid temperature $T_S$,
   wherein the thermal joint is so dimensioned to be positioned between a heat-generating component and a heat-dissipating component.

2. The thermal joint of claim 1, wherein the alloy has a plurality of solid phases when the operating temperature $T_P$ falls between the liquid temperature $T_L$ and the solid temperature $T_S$.

3. The thermal joint of claim 1, wherein the alloy has a plurality of liquid phases when the operating temperature $T_P$ falls between the liquid temperature $T_L$ and the solid temperature $T_S$.

4. The thermal joint of claim 1, wherein the alloy is a binary alloy.

5. The thermal joint of claim 1, wherein the alloy is a ternary alloy.

6. The thermal joint of claim 1, wherein the alloy is a quaternary alloy.

7. The thermal joint of claim 1, wherein the alloy includes five or more constituents.

8. The thermal joint of claim 1, wherein the alloy includes one or more of Bi, Pb, Sn, Cd, Sb, In, Tl, Te, Se, Ga, Hg, and combinations thereof.

9. The thermal joint of claim 1, wherein the alloy further includes one or more of Na, Li, Al, Mg, Ag, Cu, Zn, As, K, Rb, Ca, Au, Si, Ge, and combinations thereof.

10. The thermal joint of claim 1, wherein the alloy further includes one or more of Cu, Ag, Au, Pt, Pd, Si, Ge, Al, Mg, Zn, Cr, Ni, Be, and combinations thereof.

11. The thermal joint of claim 8, wherein the alloy further includes one or more transition metals.

12. The thermal joint of claim 9, wherein the alloy further includes one or more transition metals.

13. The thermal joint of claim 10, wherein the alloy further includes one or more transition metals.

14. The thermal joint of claim 1, wherein the alloy is a ternary alloy of Indium, Bismuth, and Tin.

15. The thermal joint of claim 1, wherein the alloy is a mixture of NaCl and MgCl.

16. The thermal joint of claim 1, wherein the alloy is Flint glass, $SiO_2/CaCO_2$, $SiO_2/PbO$, or $SiO_2/TiO_2$.

17. A device comprising:
   a heat-generating component;
   a heat-dissipating component; and
   a thermal joint positioned between the heat-generating component and the heat-dissipating component, the thermal joint consisting essentially of an alloy of at least two constituents, the alloy including at least a liquid phase and at least a solid phase, the liquid phase being substantially in equilibrium with the solid phase;
   wherein the alloy has an operating temperature $T_P$, a liquid temperature $T_L$, and a solid temperature $T_S$, and the operating temperature $T_P$ falls between the liquid temperature $T_L$ and the solid temperature $T_S$.

18. The device of the claim 17, wherein one surface of the thermal joint directly contacts one surface of the heat-generating component.

19. The device of the claim 17, wherein one surface of the thermal joint directly contacts one surface of the heat-dissipating component.

20. The device of the claim 17, wherein the device is an semiconductor device.

21. The device of the claim 17, wherein the device is a heat-exchanger.

22. An apparatus comprising the device of claim 17.

23. The apparatus of claim 22, wherein the apparatus is a computer, printer, cellular phone, television set, video cassette recorder, power amplifier, transformer, power supply circuit, high-power transistor, diode, or switching board.

24. A method of dissipating heat, comprising:
   providing a thermal joint between a heat-generating component and a heat-dissipating component, the thermal joint consisting essentially of an alloy of at least two constituents, the alloy has a liquid temperature $T_L$, and a solid temperature $T_S$; and
   operating the thermal joint at a temperature between the liquid temperature $T_L$ and the solid temperature $T_S$
   wherein the alloy includes at least a liquid phase and at least a solid phase, and the liquid phase is substantially in equilibrium with the solid phase.

25. The method of claim 24, wherein the thermal joint is operated at a temperature below the solid temperature $T_S$ after being subjected to a temperature between the liquid temperature $T_L$ and the solid temperature $T_S$.

26. The method of claim 24, wherein the heat-generating component is a semiconductor having a heat-transfer surface.

27. The method of claim 24, wherein the heat-generating component is a heat sink having a heat-transfer surface.

28. The method of claim 26, wherein the one surface of the thermal joint directly contacts the heat-transfer surface of the semiconductor.

29. The method of claim 27, wherein the one surface of the thermal joint directly contacts the heat-transfer surface of the heat sink.

30. A method of dissipating heat, comprising:
   providing a thermal joint consisting essentially of an alloy of at least two constituents, the alloy having a liquid temperature $T_L$, and a solid temperature $T_S$;
   placing the thermal joint between a heat-generating component and a heat-dissipating component, thereby defining at least one interface having interfacial voids and
   subjecting the alloy to an operating temperature above the solid temperature $T_S$ to generate a liquid phase to fill the interfacial voids; and
   lowering the operating temperature below the liquid temperature $T_L$.

31. The method of claim 30, wherein the operating temperature is lowered below the solid temperature $T_S$.

32. The method of claim 30, wherein the alloy is subjected to an operating temperature above the liquid temperature $T_L$.

* * * * *

UNITED STATES PATENT AND TRADEMARK OFFICE
CERTIFICATE OF CORRECTION

PATENT NO. : 6,343,647 B2
DATED : February 5, 2002
INVENTOR(S) : Kim et al.

It is certified that error appears in the above-identified patent and that said Letters Patent is hereby corrected as shown below:

Column 1,
Line 49, please delete the second occurrence of "in".

Column 2,
Line 50, after "to" please insert -- a --.

Column 4,
Line 25, after "(α)" please insert a space.

Column 11,
Line 33, please delete "comprising".

Signed and Sealed this

Tenth Day of September, 2002

Attest:

JAMES E. ROGAN
Attesting Officer  Director of the United States Patent and Trademark Office